US009350308B2

(12) United States Patent
Brunner

(10) Patent No.: US 9,350,308 B2
(45) Date of Patent: May 24, 2016

(54) GAIN BOOSTED DIFFERENTIAL TRANSCONDUCTANCE AMPLIFIER

(71) Applicant: Analog Devices Technology, Hamilton (BM)

(72) Inventor: Eberhard Brunner, Waakirchen (DE)

(73) Assignee: Analog Devices Global, Hamilton (BM)

( * ) Notice: Subject to any disclaimer, the term of this patent is extended or adjusted under 35 U.S.C. 154(b) by 38 days.

(21) Appl. No.: 14/296,247

(22) Filed: Jun. 4, 2014

(65) Prior Publication Data

US 2015/0357982 A1    Dec. 10, 2015

(51) Int. Cl.
*H03F 3/45* (2006.01)
*H03G 1/00* (2006.01)
*H03F 3/04* (2006.01)

(52) U.S. Cl.
CPC ............... *H03G 1/0017* (2013.01); *H03F 3/04* (2013.01); *H03F 3/45* (2013.01); *H03F 2203/45274* (2013.01)

(58) Field of Classification Search
CPC .................. H03F 3/45475; H03F 2203/45138; H03F 2203/45528; H03F 1/3211; H03F 2203/45526; H03F 2203/45638; H03F 3/45179; H03F 1/56; H03F 2200/294; H03F 2200/336; H03F 3/19; H03F 3/245; H03F 2200/318; H03F 1/26; H03F 2200/372; H03F 2203/45366; H03F 3/45094; H03F 2203/45684; H03F 3/45085; H03F 3/45098; H03F 3/45183; H03F 3/45278
USPC .................................................. 330/253, 254
See application file for complete search history.

(56) References Cited

U.S. PATENT DOCUMENTS

| | | | | |
|---|---|---|---|---|
| 3,641,450 | A * | 2/1972 | Lunn | 330/254 |
| 6,570,446 | B1 * | 5/2003 | Ling | 330/283 |
| 7,215,196 | B2 * | 5/2007 | Banba et al. | 330/254 |
| 7,323,933 | B2 * | 1/2008 | Gilbert | 330/254 |
| 2015/0303887 | A1 | 10/2015 | Brunner et al. | |

* cited by examiner

*Primary Examiner* — Khanh V Nguyen
(74) *Attorney, Agent, or Firm* — Patent Capital Group

(57) ABSTRACT

A transconductance gain stage including a pair of gain transistors, each gain transistor having a base and an emitter, the emitter of each gain transistor electrically coupled to a degenerating resistor, and the emitter of each gain transistor connected to a gain resistor.

20 Claims, 5 Drawing Sheets

GAIN BOOSTED DIFFERENTIAL TRANSCONDUCTANCE AMPLIFIER

Radio frequency up-converters typically convert lower frequency signals, such as quadrature I and Q baseband signals to higher frequencies, such as microwave frequencies. One such up-converter is disclosed in U.S. patent application Ser. No. 14/258,634. It can become difficult to reach a desired gain through the up-converter. The load after mixing, shown as 101 in FIG. 1, at the output of the up-converter relative to the baseband input determines the up-converter gain.

Typically, two ways to change the gain in a transconductance (Gm) gain amplifier exist. One can increase the load resistance for a fixed input Gm gain stage. Alternatively, one can increase the transconductance of the baseband input stage. These should occur while taking into account that the inputs to the transconductance stage will typically match a source impedance, typically 50 ohms single ended or 100 ohms differential.

DETAILED DESCRIPTION OF THE EMBODIMENTS

Figure 1:
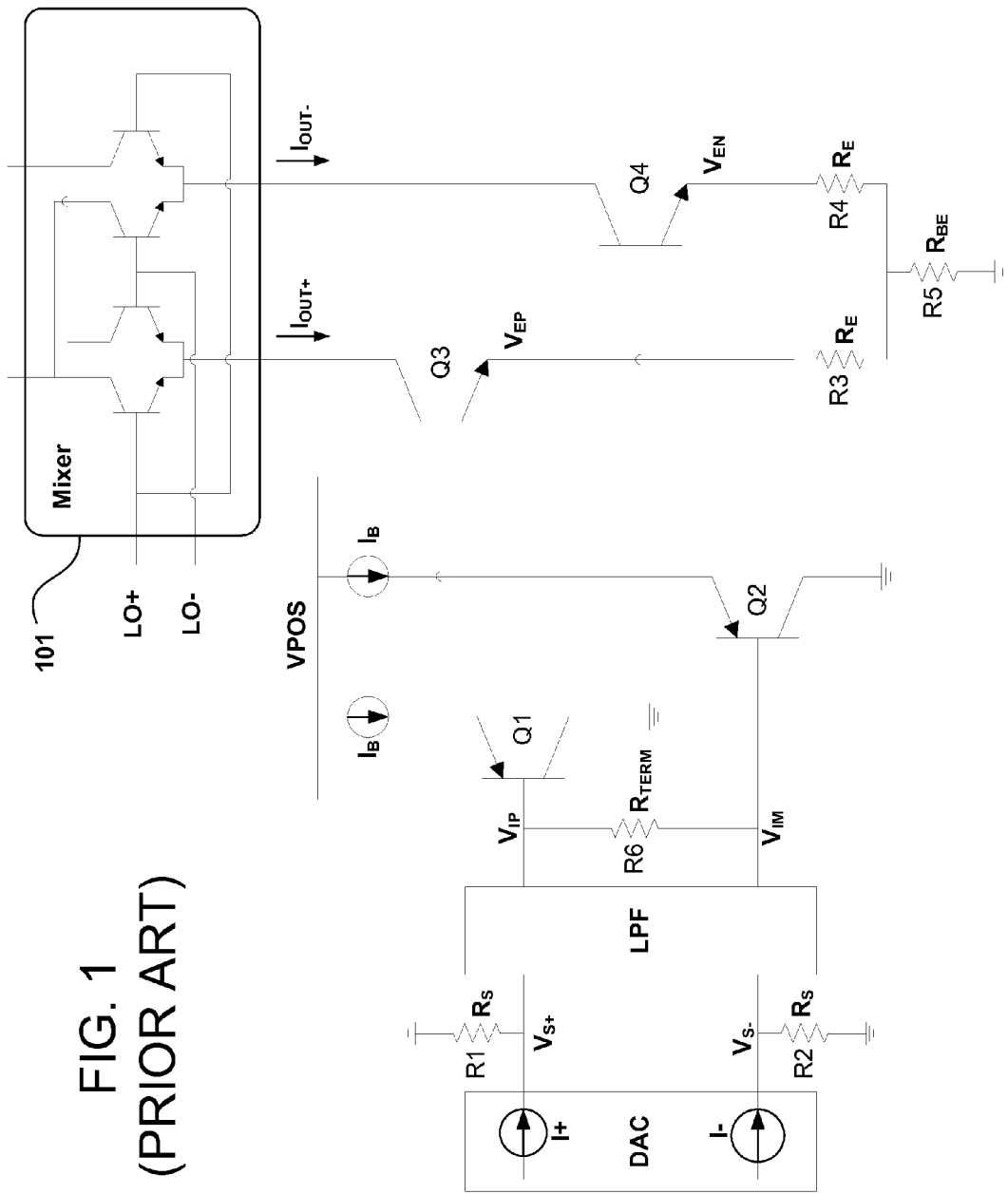
FIG. 1 shows a prior art embodiment of a gain boosted differential transconductance amplifier.

FIG. 1 shows a prior art transconductance (Gm) amplifier for a baseband interface to an up-converter. The mixer 101 can also be replaced by cascode transistors followed by load resistors. The load resistors convert the current generated by the Gm stage back into a voltage to generate gain. FIG. 1 shows one example of an interface from a typical Digital to Analog Converter (DAC) to the input of the Gm amplifier stage. Resistors R1 and R2 set the input common-mode voltage and together with R6 determine the input signal swing $V_{IP}$ and $V_{IM}$. Typically a Low Pass Filter (LPF) is inserted between the DAC and the amplifier inputs. In the following discussion, resistor names will be numbered and their values will be letters. Typical values for $R_S$ and $R_{TERM}$ are 50Ω and 100Ω respectively, while $R_E$ and $R_{BE}$ might be 20Ω and 10Ω respectively. Nodes $V_{EP}$ and $V_{EN}$ will be approximately equal to the bias voltages on the inputs $V_{IP}$ and $V_{IM}$ as will be explained below.

Normally an input match to a differential source of 100Ω, 50Ω per side, creates a broadband match and then one needs to add a 100Ω termination resistor ($R_{TERM}$) across the input to satisfy the input match. Many applications have a further constraint to process signals down to DC in the case of baseband signals that have very low frequency content.

Figure 2:
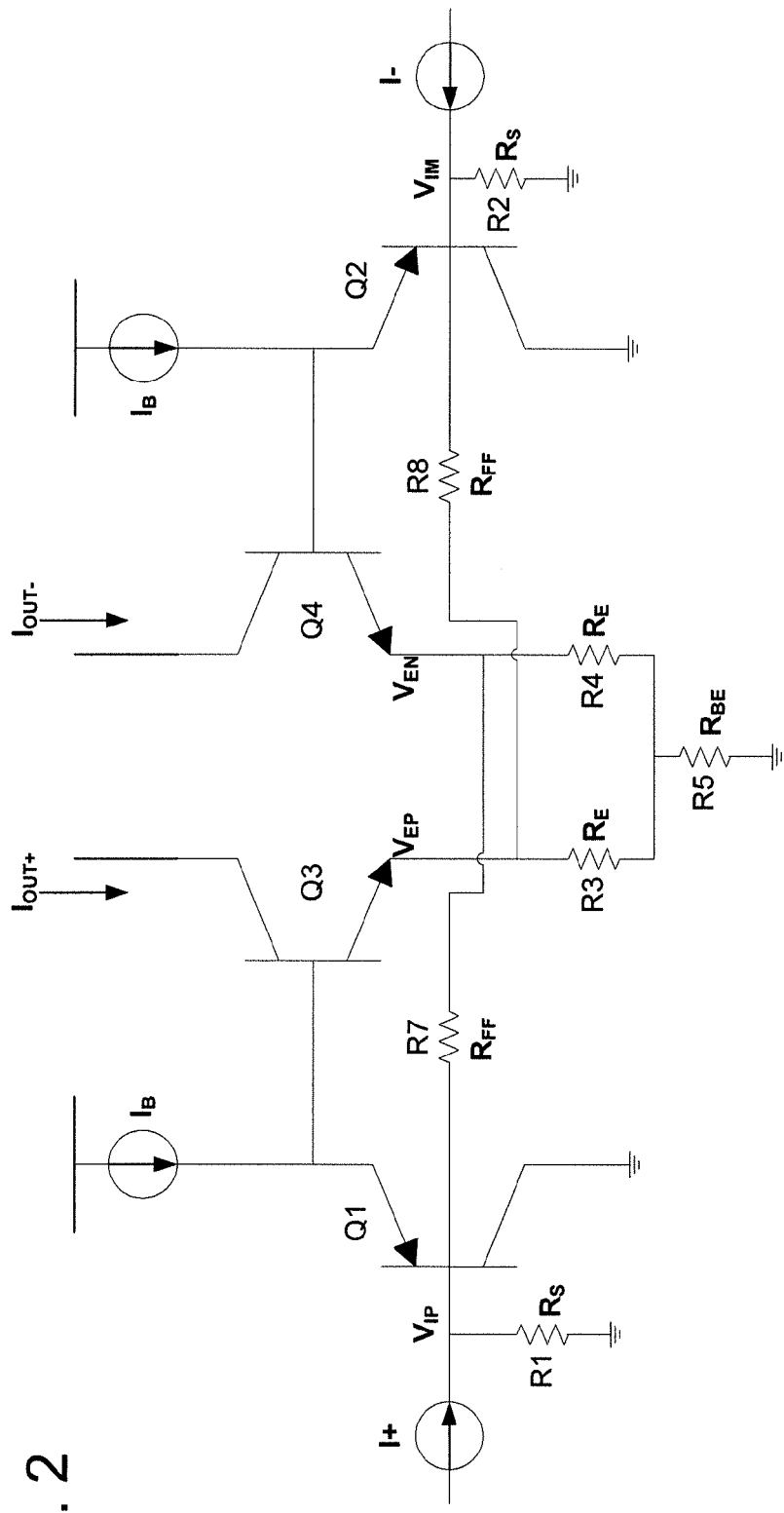
FIG. 2 shows an alternative embodiment of a gain boosted transconductance amplifier.

FIG. 2 shows an embodiment in which $R_{TERM}$ has been replaced by resistors R7 and R8 with value $R_{FF}$. These resistors connect from the PNP level shifter base inputs to the emitters of the resistively degenerated NPN differential pair and implement the input match and at the same increase the gain of the Gm stage compared to the one in FIG. 1. To the first order there is unity gain from the base of the PNP transistors Q1 and Q2 to their respective emitters because the transistors are biased by high impedance current sources. This causes the entire input signal to show up at the bases of the NPN transistors, Q3 and Q4. The PNP transistors act as emitter followers. The term 'degenerated' as used here means that there is an element in the emitter/source of a transistor, to increase its linearity.

In addition, each of the NPNs Q3 and Q4 acts as unity-gain followers. The gain to their emitters from their respective bases is RE/(RE+re), which in the limit will go to '1' as 're'=1/gm becomes much smaller than the degeneration resistors $R_E$, in this embodiment R3 and R4. $R_E$ might be 20Ω in a typical application. Since the same bias current flows through '$R_E$' and 're', the voltage drop across $R_E$ is relative to $V_T$=kT/q and determines how close to '1' the follower gain is. The larger the voltage drop across $R_E$ can be the better, however, due to bias and headroom constraints one cannot arbitrarily increase the voltage drop across $R_E$. If the bias current in transistors Q3 and Q4 is 12.5 mA, then 1/gm=re=2Ω. For these values, the NPN follower gain is 20/(20+2)=0.909. One should note that if $R_E$ and $R_{BE}$ are equal to 20Ω and 10Ω respectively, and an input common-mode voltage equals 0.5 V, the bias currents through transistors Q3 and Q4 will be close to 12.5 mA.

Because the input signal can be ground referenced when driven from a current DAC, and the DAC output constraints will set the voltages needed, one cannot arbitrarily set the voltage drop across $R_E$. For example, in the example used the DAC input 50Ω will result in the voltage being set at 0.5V for maximum swing. For a typical DAC with 0-20 mA of output current per side, this will result in a maximum differential swing of 0.25 to 0.75 V per side. This in turn sets the voltage across resistor R5 ($R_{BE}$), for the example values above it is at 0.25 V.

Furthermore, for linearity reasons the voltage drop across R3 and R4 ($R_E$) should also be about 0.25 V. The only variable left is the bias current through transistors Q3 and Q4 as that sets 're'=1/gm=$V_T/I_C$ and its maximum will be constrained by power dissipation and transistor performance. As the load resistance in a typical RF amplifier most likely is also constrained for output matching reasons, typically 50Ω, and similar headroom constraints appear as at the input due to bias current and the desired signal swing, or output power, then the achievable gain is within a narrow range for a given supply voltage.

Often there is a need for more gain yet the typical embodiment in FIG. 1 does not allow more gain to be achieved. The embodiment in FIG. 2 is one way of achieving up to 6 dB more gain without changing the biasing, while simultaneously achieving the desired input match. In the embodiments of FIG. 2, the 100 Ohm resistors R7 and R8 are cross-connected. Since the inputs I+ and I− are driven differentially from a DAC, the emitter voltage ($V_{EN}$) of the right NPN Q4 will be to first order equal to $V_{IM}$, the voltage at the negative input. $V_{IP}$=Vin/2 while $V_{IM}$=−Vin/2 so that the current across resistor R7 ($R_{FF}$) will be approximately Vin/$R_{FF}$. The left side with NPN Q3, emitter voltage (VEP), and R8 is analogous and a mirror image of the description above.

Figure 3:
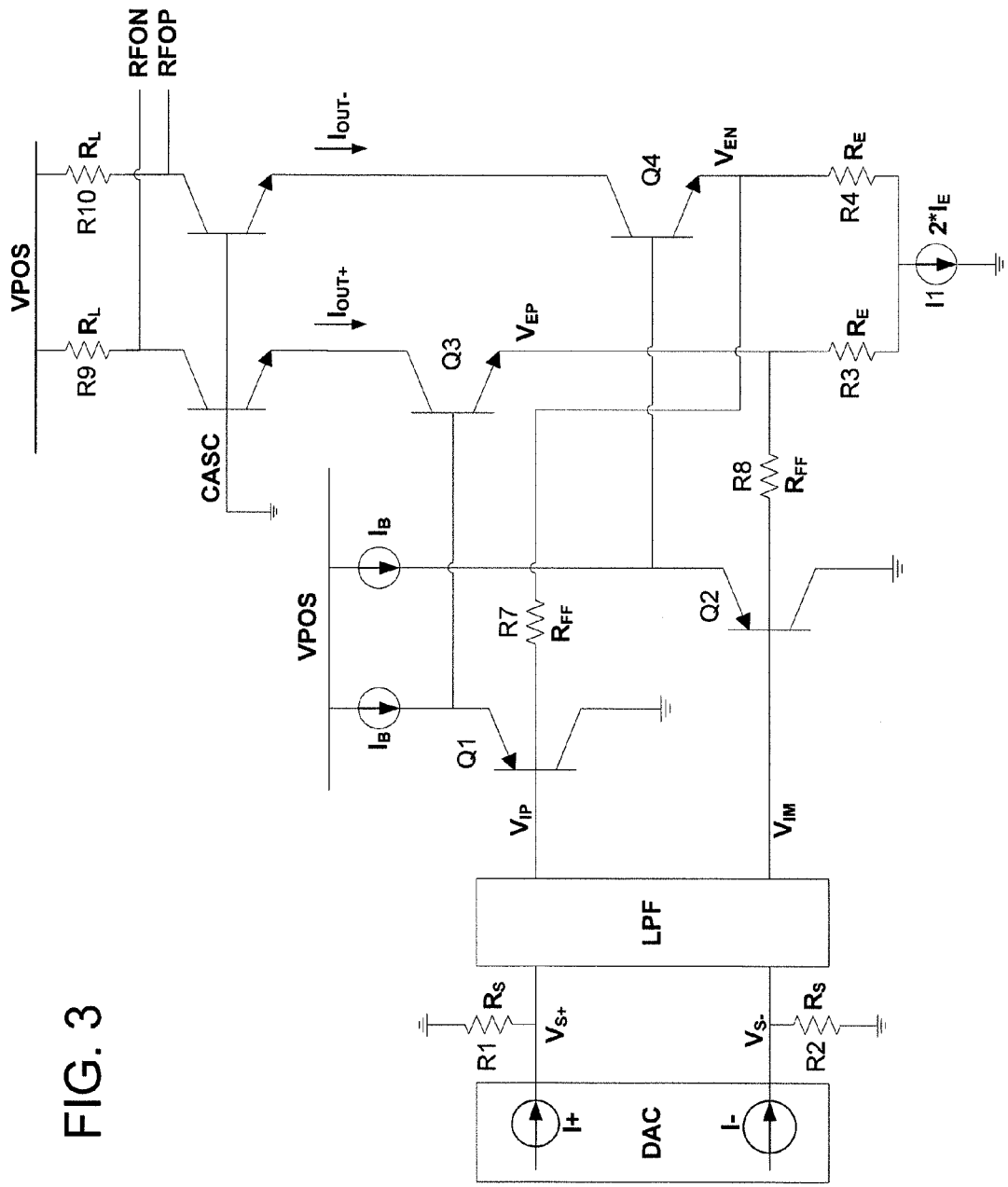
FIG. 3 shows an embodiment of a gain boosted differential transconductance amplifier.

FIG. 3 shows an embodiment of a complete circuit as it might be implemented in an amplifier. Typically, in FIG. 1, $R_{TERM}$=2*$R_S$ to match to the source resistors R1 and R2 with value $R_S$. This parameter may also be used in the embodiments of FIG. 3. The two $R_E$ resistors R3 and R4, the current source 2*IE and the corresponding 're'=1/gm of the NPNs Q3 and Q4 make up a resistively degenerated transconductance differential pair. If $R_E$ is much larger than the 're'=$V_T/I_C$=1/gm, then to the first order the resistors having value $R_E$, R3 and R4, together with load resistors having value $R_L$, R9 and R10, set the gain of the amplifier stage. The desired linearity of this stage is primarily set by how large the voltage drop is across $R_E$ vs. $V_T$=kT/q of the NPN transistors Q3 and Q4, a good starting point is about $10*V_T$=approx. 250 mV at 27° C.

The output power, also referred to as the signal swing that needs to be delivered to a load, together with a good output match will set the value for $R_L$ together with VPOS minus the voltage at the CASC node. The output match may also be referred to as the output reflection coefficient (S22) in a 2-port system, which is what most amplifiers are. The input port is the first port and the output port is the second port. A match is often referred to as S22 for a load match; while S11 is the input reflection coefficient (input match). Once $R_L$ has been thus determined, the gain will be set by $R_L/(R_E+re)$ ignoring secondary losses. This will also force the value of the bias current ($2*I_E$) due to the linearity constraint and the load power that needs to be delivered.

The above design restrictions typically force all the values and thereby the gain of this stage. One would often like to be able to adjust gain independently of signal power and linearity, the embodiments described in this disclosure provides this extra degree of freedom by taking advantage of the input match as an additional variable that allows the gain to be increased.

The PNP level shifters may act as simple gain-of-one followers. Furthermore, the NPNs may act in the same manner. In this case the voltage gain from nodes $V_{IP}$ to $V_{EP}$ in FIG. 3 should be approximately one, the same is true for the negative input $V_{IM}$ to $V_{EN}$. If this circuit is driven differentially, as will more than likely be the case in an actual application where the signal source is a DAC as indicated in FIGS. 1 and 3, then one could cross-connect two resistors of value $R_{FF}$ from the positive input $V_{IP}$ to the negative emitter $V_{EN}$. The reverse is also true. This provides the extra degree of freedom to increase the gain of the Gm stage, making this a boosted Gm amplifier stage.

In the usual case that an input match is desired, $R_{FF}$ needs to be equal to $2*R_S$, where $R_S$ is the source resistance value per side, R1 and R2, in FIG. 3. The input resistance per side as seen looking towards the amplifier will then be:

$$I_{IN} = \frac{V_{IP} - V_{EN}}{R_{FF}} = \frac{V_{IP} - V_{EN}}{2*R_S} = \frac{V_{IP} - V_{IM}}{R_{TERM}} = \frac{2*V_{IP}}{2*RS} = \frac{V_{IP}}{RS}$$

$$R_{IN} = \frac{V_{IP}}{I_{IN}} = R_S$$

Note that the resistance as seen looking back from node EN to IP is also equal to $R_S$. Furthermore, due to symmetry, the input resistance on the negative side, IM, is also $R_S$ when $R_{FF}=2*R_S$.

The gain is increased by the additional signal current $I_{IN}$ that is injected or removed into the nodes EN and EP via resistors $R_{FF}$. This reduces or increases the emitter currents, and thereby collector currents of Q3 and Q4 when compared to FIG. 1, and thereby also the currents into the load resistors R9 and R10. The increase in gain is dependent on the value of $R_E$ relative to the effective resistance as seen from nodes EP and EN back towards the input. In the case of $R_{FF}=2*RS$, the effective resistance is $R_S$. The increase in gain compared to FIG. 1 is then:

$$\Delta Gain = \frac{R_E}{R_E \| R_S} = \frac{R_E + R_S}{R_S}$$

From this it can be observed that for a value of $R_E=R_S$, the maximum increase in gain is a factor-of-two (6 dB). For smaller values of $R_E$ relative to $R_S$, the increase is correspondingly smaller. Furthermore, it is important to note that the equations above only hold while there is enough bias current in the NPN differential pair. At the extremities when the input signal becomes large relative to the signal handling capability of the Gm stage, the input match and gain will deviate from the equations shown.

Figure 4:
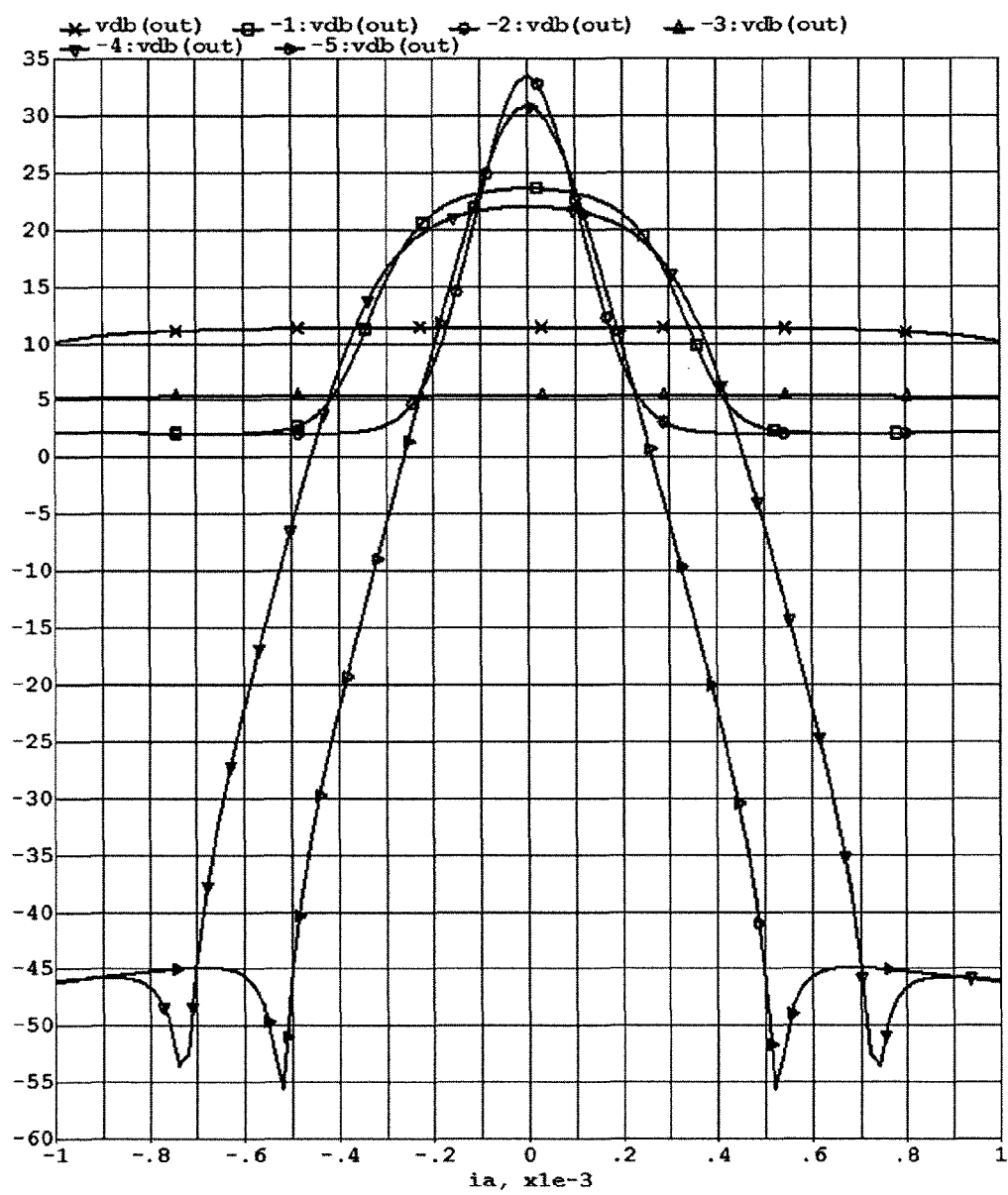
FIG. 4 shows a graph of gain versus input current for a test embodiment.

The simulation result in FIG. 4 shows comparisons for various values of $R_E$ relative to $R_S$. For $R_E=R_S$, both boosted and un-boosted stages are fairly linear over the input current sweep of −1 to +1 mA. Note that in the embodiment used, the design is scaled to 1/10th from a typical DAC with 0 to 20 mA output current down to 0 to 2 mA but this is not a limitation and was only done for convenience. $I_{Bias}$–DAC=1 mA in the simulation such that the input current is from 0 to 2 mA per each side, with positive and negative inputs. However, the gain of the boosted stage is 6 dB higher in the middle of the range. One should note that the max signal handling capability of the boosted stage is reduced, the gain starts to "droop" beyond about ±0.8 mA, which has to do with the fact that the max input signal handling capability of the Gm stages are set by the voltage drop across $R_E=R_E*I_E$, the smaller that number relative to $V_T$, the lower the linear input range.

The three cases shown in FIG. 4 compare the Gm without boost, as in FIG. 1 with $R_{TERM}=2*R_S$, and with boost, as in FIG. 3 with $R_{FF}=2*R_S$, from the top: $R_E=0$; $R_E=R_S/10$; and $R_E=R_S$. In all three cases, the gain of the boosted Gm stage is larger compared to the un-boosted stage. In addition the noise of the boosted stage is lower as the termination resistor is now also used to increase gain, not just to achieve the termination as in FIG. 1.

Figure 5:
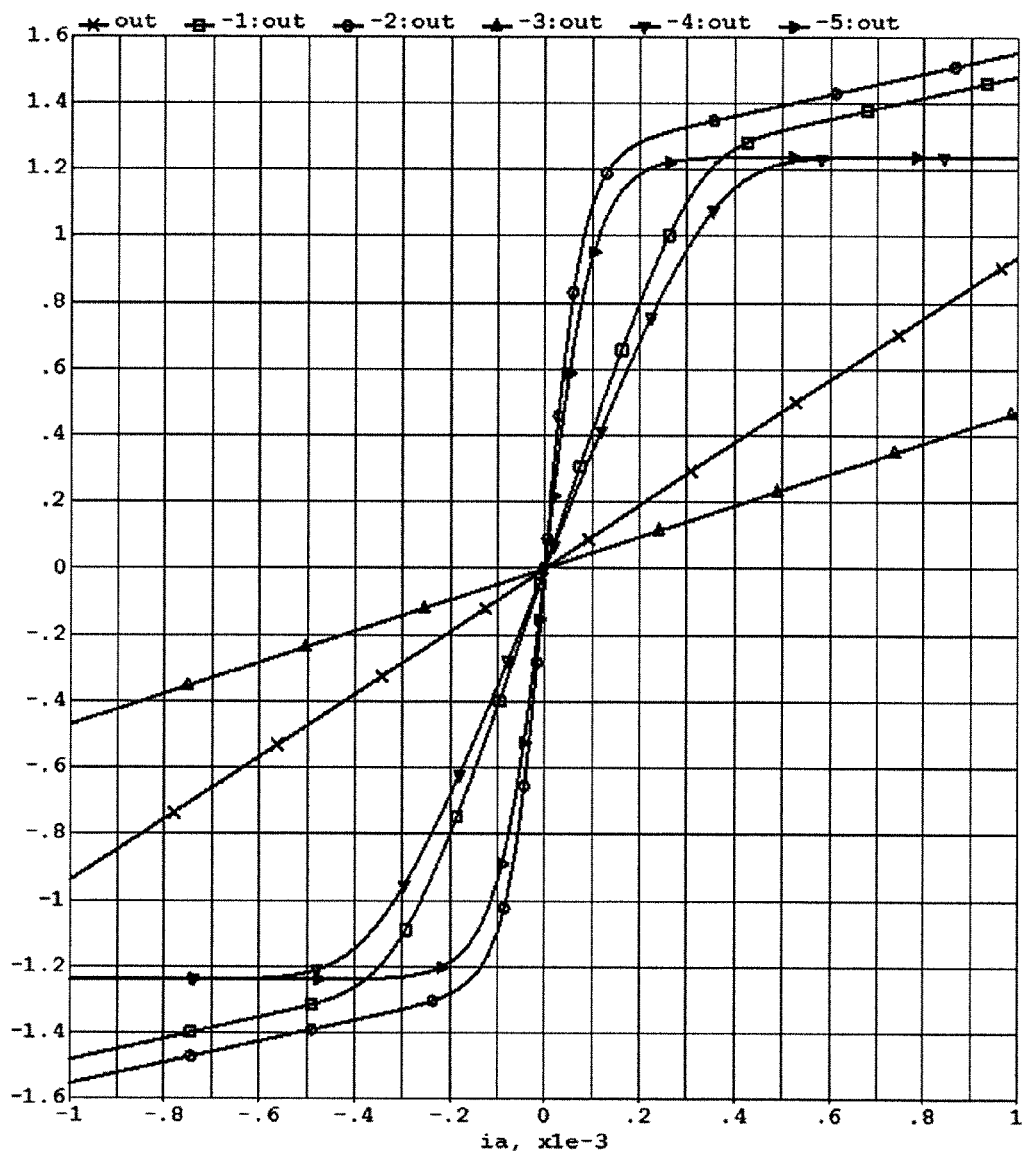
FIG. 5 show a graph of a differential voltage swing at an output for a test embodiment.

FIG. 5 shows the differential DC voltage swing at the output for the same conditions as in FIG. 4. In this result it becomes clear that since the linear input signal handling capability of the Gm stage is set by the voltage drop across $R_E \rightarrow R_E*I_E$, then by boosting the gain with the technique described here, the boosted stage will also reach the signal handling limit more quickly because of the extra signal current that gets injected or subtracted into nodes EN and EP via resistors R7 and R8 ($R_{FF}$) respectively.

It should be pointed out that as long as the input is DC coupled, the current source I1 ($2*I_E$) in FIG. 3 that sets the bias current for the resistively degenerated NPN differential pair can be replaced by a resistor R5 as shown in FIGS. 1 and 2. The bias current will be set by the voltage across R3, R4 and R5 which is set from the DAC via the input nodes IP and IM. The circuit needs to be driven differentially for the gain-boost to work.

In this manner, one can achieve increased gain with the same bias current used in the prior art transconductance stage. These embodiments also achieve this gain with lower noise. The source impedance match is preserved without increasing noise as in the prior art. The differential transistors are simultaneously used as common-source amplifiers and common-base amplifiers.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A transconductance gain stage, comprising:
    first and second gain transistors, each gain transistor having a base, an emitter, and a collector;
    first and second degenerating resistors, wherein the emitter of the first gain transistor is electrically coupled to the first degenerating resistor, and the emitter of the second gain transistor is electrically coupled to the second degenerating resistor;
    first and second feedforward resistors, wherein the emitter of the first gain transistor is electrically coupled to the first feedforward resistor, and the emitter of the second gain transistor is electrically coupled to the second feedforward resistor; and
    a level shifter including first and second shifter transistors, wherein each shifter transistor has a base and an emitter, the base of the first gain transistor is coupled to the emitter of the first shifter transistor, and the base of the second gain transistor is coupled to the emitter of the second shifter transistor.

2. The transconductance gain stage of claim 1, wherein the first and second feedforward resistors are electrically coupled to the second and first shifter transistors, respectively.

3. The transconductance gain stage of claim 1, wherein first and second differential inputs to the transconductance gain stage are terminated by first and second termination resistors, respectively, each having a termination resistance, and the first and second feedforward resistors each have a feedforward resistance equal to twice the termination resistance.

4. A system, comprising:
    a digital-to-analog converter to provide baseband signals;
    a transconductance gain stage to receive analog signals from the digital-to-analog converter and provide output signals with added gain, comprising:
        first and second gain transistors, each gain transistor having a base, an emitter, and a collector,
        the emitter of the first gain transistor electrically coupled to a first degenerating resistor and to a first feedforward resistor, and
        the emitter of the second gain transistor electrically coupled to a second degenerating resistor and to a second feedforward resistor; and
    one of either a mixer or cascode transistors to receive the output signals from the collector of each gain transistor.

5. The system of claim 4, further comprising a low pass filter arranged between the digital-to-analog converter and the transconductance gain stage.

6. The system of claim 4, further comprising a level shifter.

7. The system of claim 6, wherein the level shifter comprises first and second shifter transistors, each shifter transistor has a base and an emitter, the base of the first gain transistor is coupled to the emitter of the first shifter transistor and the base of the second gain transistor is coupled to the emitter of the second shifter transistor.

8. The system of claim 6, wherein the bases of the first and second shifter transistors are electrically coupled to system inputs.

9. The system of claim 7, wherein the first and second feedforward resistors are electrically coupled to the second and first shifter transistors, respectively.

10. A system for differential amplification, comprising:
    first and second gain transistors, each gain transistor having a base, an emitter and a collector;
    first and second shifter transistors, wherein:
        each shifter transistor has a base, an emitter, and a collector,
        the emitter of the first shifter transistor is electrically coupled to the base of the first gain transistor, and
        the emitter of the second shifter transistor is electrically coupled to the base of the second gain transistor; and
    first and second feedforward resistors, wherein the first feedforward resistor is electrically coupled between the base of the first shifter transistor and the emitter of the second gain transistor, and the second feedforward resistor is electrically coupled between the base of the second shifter transistor and the emitter of the first gain transistor.

11. The system of claim 10, further comprising:
    a first termination resistor electrically coupled to the base of the first shifter transistor; and
    a second termination resistor electrically coupled to the base of the second shifter transistor;
    wherein the first and second termination resistors each have a same termination resistance.

12. The system of claim 11, wherein the first and second feedforward resistors each have a same feedforward resistance, and the feedforward resistance is equal to twice the termination resistance.

13. The system of claim 11, further comprising:
    a component coupled between the first and second termination resistors and the bases of the first and second shifter transistors, respectively.

14. The system of claim 13, wherein the component is a low pass filter.

15. The system of claim 14, wherein an input resistance of the low pass filter is the same as an output resistance of the low pass filter.

16. The system of claim 10, wherein the first and second gain transistors are NPN transistors.

17. The system of claim 10, wherein the first and second shifter transistors are PNP transistors.

18. The system of claim 10, further comprising:
    a digital-to-analog converter electrically coupled to the first and second shifter transistors, wherein a common mode current output by the digital-to-analog converter biases the first and second shifter transistors.

19. The system of claim 18, wherein the first and second feedforward resistors each have a feedforward resistance of 100 ohms.

20. The system of claim 18, further comprising:
    a low pass filter coupled between the digital-to-analog converter and the first and second shifter transistors.

* * * * *